United States Patent
Kuenemund

(10) Patent No.: US 8,334,707 B2
(45) Date of Patent: Dec. 18, 2012

(54) STORAGE CIRCUIT WITH FAULT DETECTION AND METHOD FOR OPERATING THE SAME

(75) Inventor: Thomas Kuenemund, Munich (DE)

(73) Assignee: Infineon Technologies AG, Neubiberg (DE)

( * ) Notice: Subject to any disclaimer, the term of this patent is extended or adjusted under 35 U.S.C. 154(b) by 1024 days.

(21) Appl. No.: 12/344,916

(22) Filed: Dec. 29, 2008

(65) Prior Publication Data

US 2010/0169752 A1    Jul. 1, 2010

(51) Int. Cl.
- G06F 7/38    (2006.01)
- G06F 7/04    (2006.01)
- G06F 17/30   (2006.01)
- H03K 19/00   (2006.01)
- H03L 7/00    (2006.01)

(52) U.S. Cl. ............... 326/46; 326/93; 726/27; 327/144

(58) Field of Classification Search .......... 326/9, 12–14, 326/93, 95, 98; 327/144, 197–200; 726/27–30; 713/169–171; 714/100, 746, 55; 365/156, 365/189.05, 194

See application file for complete search history.

(56) References Cited

U.S. PATENT DOCUMENTS

| | | | |
|---|---|---|---|
| 6,504,411 B2* | 1/2003 | Cartagena | 327/199 |
| 7,529,329 B2* | 5/2009 | Popescu et al. | 375/354 |
| 8,049,529 B2* | 11/2011 | Fulcomer | 326/11 |
| 2006/0294422 A1* | 12/2006 | Fukuda | 714/15 |
| 2007/0182575 A1 | 8/2007 | Kunemund | |
| 2008/0120525 A1* | 5/2008 | Agarwal | 714/731 |
| 2010/0026338 A1* | 2/2010 | Fulcomer | 326/11 |
| 2010/0070811 A1* | 3/2010 | Goessel et al. | 714/746 |
| 2010/0153824 A1* | 6/2010 | Pribbernow et al. | 714/780 |
| 2010/0164507 A1* | 7/2010 | Kuenemund | 324/537 |
| 2011/0096612 A1* | 4/2011 | Steiner et al. | 365/189.09 |

FOREIGN PATENT DOCUMENTS

DE    10 2005 058 238 A1    6/2007

\* cited by examiner

Primary Examiner — Shawki Ismail
Assistant Examiner — Dylan White
(74) Attorney, Agent, or Firm — Dickstein Shapiro LLP

(57) ABSTRACT

Some embodiments show a storage circuit with fault detection. The storage circuit comprises, first and second fault detection circuits each comprising a first stable state and a second stable state, wherein each of the first and the second fault detection circuits is configured such that a fault signal strength necessary to cause switching from the first stable state to the second stable state is different from a fault signal strength necessary to cause switching from the second stable state to the first stable state. Furthermore the storage circuit comprises a data input, a circuitry configured to cause the first fault detection circuit to assume the first stable state and the second fault detection circuit to assume the second stable state to store a data signal applied to the data input and a first output indicative of the state of the first fault detection circuit and a second output indicative of the state of the second fault detection circuit, wherein an invalid combination of the signal states at the first and second outputs indicate a fault.

18 Claims, 10 Drawing Sheets

STORAGE CIRCUIT WITH FAULT DETECTION AND METHOD FOR OPERATING THE SAME

TECHNICAL FIELD

In order to obtain information regarding the functionality of an integrated circuit (IC) or in order to change or read data or signals on an integrated circuit, integrated circuits may be the target of a manipulation attempt or an external attack. Such an attack on an integrated circuit may be, for example, performed by means of ionizing radiation or the use of fluctuations of a supply voltage of the integrated circuit. A manipulation attack may also be performed by probing a signal or forcing a signal state on the integrated circuit. Such a manipulation or attack may be, for example, particularly severe for security relevant integrated circuits, e.g., for smart cards etc. In general, all types of integrated circuits may be the target of an attack or manipulation attempt. An integrated circuit may be protected against such an undesired manipulation, an analysis attempt or in general a fault by different means.

SUMMARY

Some embodiments relate to a storage circuit with fault detection. The storage circuit may fulfill a double function by storing data and detecting a fault, for example upon an error, a manipulation attempt or an attack on the storage circuit. Some embodiments relate to a method for operating the storage circuit with fault detection.

DETAILED DESCRIPTION

Figure 1A:
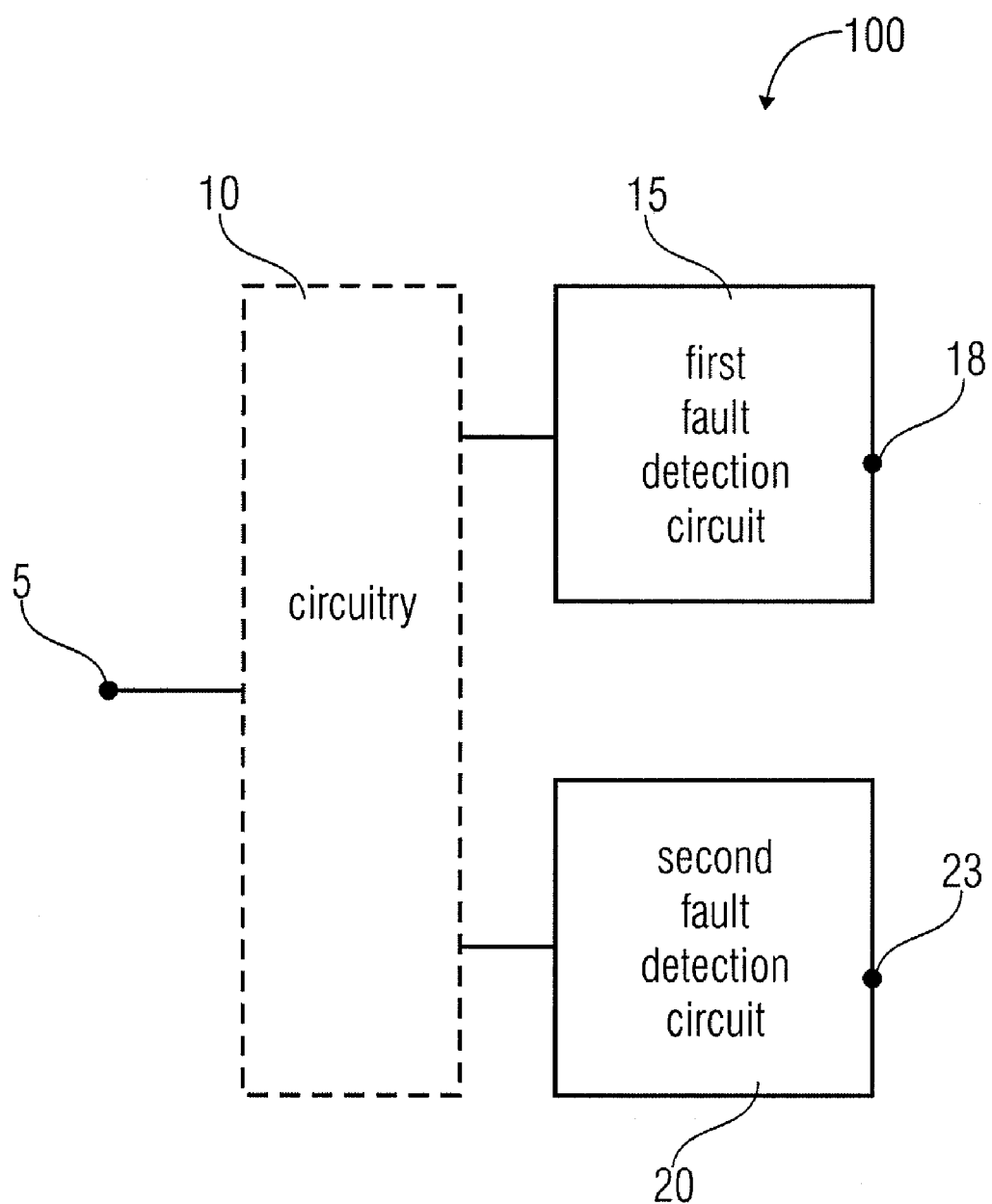
FIG. 1a shows a schematic representation of a storage circuit with fault detection according to some embodiments.

FIG. 1 illustrates a schematic storage circuit with fault detection according to an embodiment. The storage circuit 100 with fault detection comprises a data input 5 and first 15 and second 20 fault detection circuits, each comprising a first stable state and a second stable state, wherein each of the first 15 and the second 20 fault detection circuits is configured such that a fault signal strength necessary to cause switching from the first stable state to the second stable state is different from a fault signal strength necessary to cause switching from the second stable state to the first stable state. Furthermore, the storage circuit 100 comprises a circuitry 10 configured to cause the first fault detection circuit 15 to assume the first stable state and the second fault detection circuit 20 to assume the second stable state to store a data signal applied to the data input. At a first output 18 indicative of the state of the first fault detection circuit 15 and at a second output 23 indicative of the state of the second fault detection circuit 20 a fault is indicated if an invalid combination of signal states at the first 18 and second 23 outputs appears.

According to some embodiments one of the first 15 and second 20 fault detection circuits may be set to the first stable state and the other fault detection circuit may be set to the second stable state by applying data to be stored at the data input. Therewith data or a bit of information can be stored in the fault detection circuits and a valid combination of states may appear at the first and the second output during a regular operation of the storage circuit. A signal state at one of the first and second output may then correspond to the stored data. At the same time one of the two fault detection circuits is thereby in the more sensitive first or second stable state and hence a fault, for example, upon an attack can be detected. That is, the storage circuit with fault detection may store data on the one hand and detect faults on the other hand. A combination of valid signal states at the first and the second output may be, for example, a low level—"0"—and a high level—"1"—also designated as (0,1). Since a fault signal strength necessary to cause switching from the first stable state to the second stable state is different from a fault signal strength which is necessary to cause switching from the second stable state to the first stable state, a fault upon an error, an attack or an manipulation attempt can be detected. In case of a fault, the more sensitive first or second stable state on one of the two fault detection circuits may be switched to the less sensitive stable state and hence at the first 18 and second 23 output an invalid combination of signal states may appear. Such an invalid combination of states may be, for example, (0,0) or (1,1). This means the two fault detection circuits may ensure, that at least one of the two fault detection circuit is during regular operation in the more sensitive stable state. More sensitive may, in this context, mean that a fault or disturbance, which is necessary to effect a fault detection circuit to switch from a first state to a second state is smaller than a fault or disturbance, which is necessary to effect a fault detection circuit to switch from a second state to a first state.

According to further embodiments, "more sensitive" may also mean, that a change from the more sensitive first state to the less sensitive second state upon a fault is faster than a change from the second state to first state. This means that the fault detection circuit in the more sensitive first state switches faster upon a fault, caused by an attack, an error or a manipulation, in the less sensitive second state than conversely. The storage circuit with fault detection may comprise a double function. First data can be stored into the storage circuit 100 and second a fault, a manipulation of stored data or an error of the storage circuit can be recognized or detected. According to embodiments, storage data or information can be written to the storage circuit 100 and can be read from the storage circuit 100 as well. The storage circuit may be configured to receive data, which can be stored into the storage circuit. An error attack on the stored data or information can be recognized, an alarm signal can be triggered and an alarm output signal for further use can be provided.

Figure 1B:
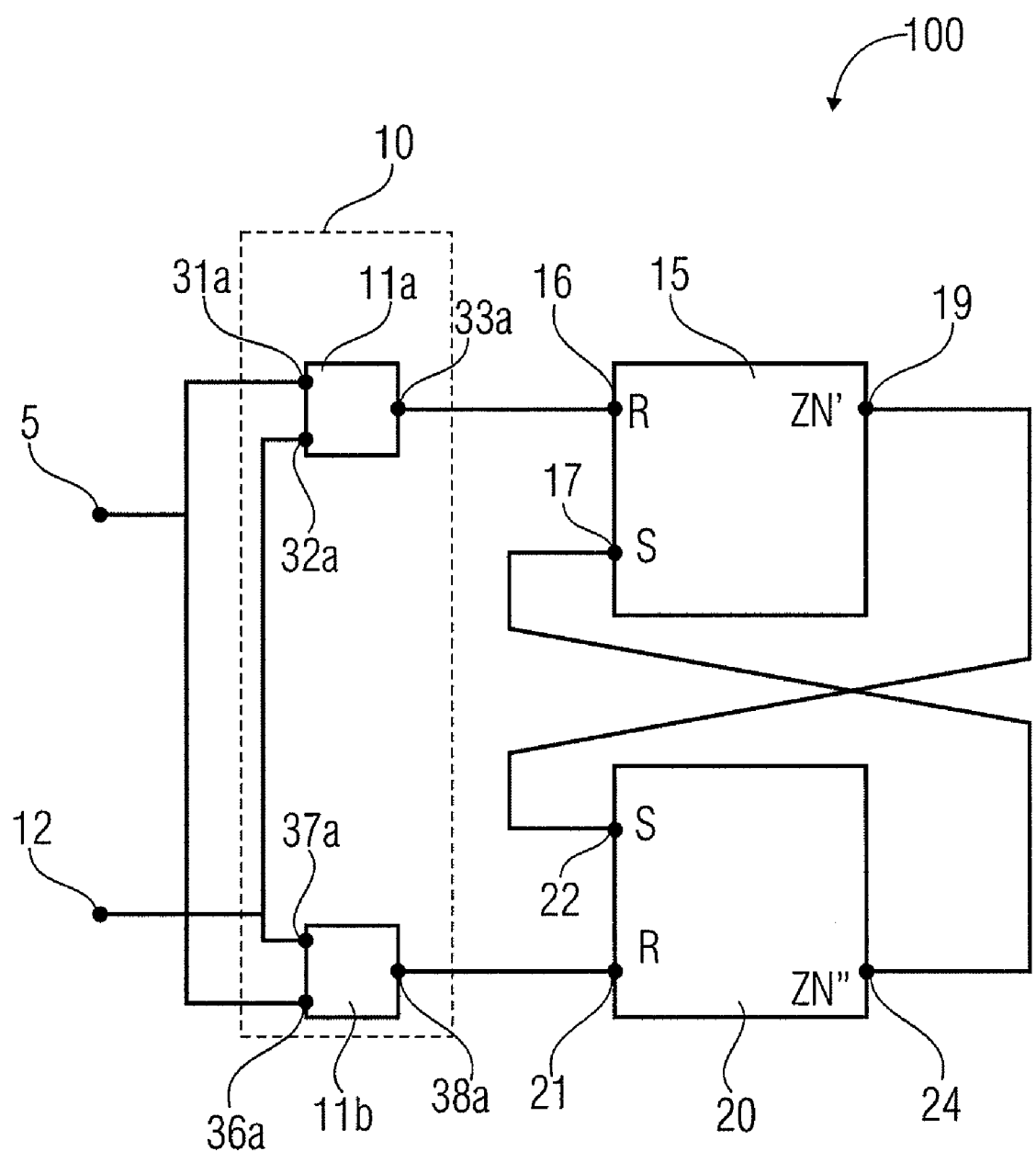
FIG. 1b shows a schematic representation of a storage circuit with fault detection according to another embodiment.

In FIG. 1b a storage circuit 100 with fault detection comprises a data input 5 and an enable input 12. Furthermore a first fault detection circuit 15 and a second fault detection circuit 20. The first fault detection circuit 15 may have a reset input 16, a set input 17 and at least a first output ZN' or 19. The second fault detection circuit 20 may comprise a second reset input 21, a second set input 22 and at least a second output ZN" or 24. The circuitry 10 of the storage circuit 100 may comprise a first logic circuit 11a and a second logic circuit 11b. The first logic circuit 11a has an input 31a coupled to the data input 5 and a second input 32a coupled to the enable input 12. The output 33a of the first logic circuit 11a is coupled to the reset input 16 of the first fault detection circuit 15. Moreover the second logic circuit 11b comprises an input 36a coupled to the data input 5 and a second input 37a which is coupled to the enable input 12. The output 38a of the second logic circuit 11b is coupled to the reset input 21 of the second fault detection circuit 20. As it is shown in FIG. 1b, the first output 19 of the first fault detection circuit 15 is coupled to the set input 22 of the second fault detection circuit 20. The first fault detection circuit 15 and the second fault detection circuit 20 may be cross-coupled to each other. Furthermore, the second output 24 of the second fault detection circuit 20 is coupled to the set input 17 of the first fault detection circuit 15. A first combination of signal states at the first and the second output indicate storage data which are stored into the storage circuit 100 and a second combination of signal states of the first and second output indicate a fault or manipulation of the storage circuit.

In some embodiments, digital circuits are used as fault detectors. These digital circuits can be, on one hand, sensitive to, for example, the effect of ionizing radiation or to fluctuations of a supply voltage, e.g., fluctuations of the supply voltages VDD-VSS of an integrated circuit. VDD may be a higher supply voltage corresponding to the logic state or level "1" and VSS may be a lower supply voltage corresponding to the logic level or state "0". On the other hand, the detector circuit, for example, the first fault detector circuit 15 and the second fault detector circuit 20, may be similar to circuits of the most sensitive possible attack targets. This means, the digital attack detector circuit cells may be as similar as possible as regular digital circuits which may be most sensitive with respect to a fault or an attack. The fault detection circuit is sometimes named fault attack detection cell (FAD cell) herein.

A fault based on a manipulation, an error or an attack on the storage circuit may result in an output at the first output 19 and at the second output 24 which indicate a fault. This means, an attack or a manipulation or an error on one of the devices or elements which are forming the storage circuit 100 or on stored data may result in an indication of such an unwanted event.

According to some embodiments, storage data which are applied to the data input 5 of the storage circuit 100 can be written to the storage circuit, if an enable signal is applied to the enable input 12. The storage data written to the storage circuit 100 can then be kept or stored if the enable signal at the enable input is resumed or a disable signal is applied to the enable input 12. This means that the circuitry 10 may be configured to allow storage of a data signal applied to the data input if an enable signal is applied to the enable input and to prevent storage of the data signal applied to the data input if the enable signal is not applied to the enable input. The storage data are stored in the fault detection circuits 15, 20. The fault detection circuits may work as a flip-flop comprising a bi-stable latch. The stored data may be provided either at the first output 19 or the second output 24. At the other output the opposite data may appear. For example, a "high state" or "1" may be stored on the storage circuit 100 then, for example, a "1" is provided at the first output 19 and the opposite "low state" or "0" at the second output 24. This may be a first combination of states at the first and second output indicating stored data. Upon an attack, a manipulation or an error, a second combination of states may cause at the first and the second output indicating a fault. Such a second combination may be, for example, a "1" at the first output and a "1" at the second output or a "0" at the first output and a "0" at the second output. In case of a fault, the first and the second output do not comprise opposite logic states, in this embodiment.

Figure 2:
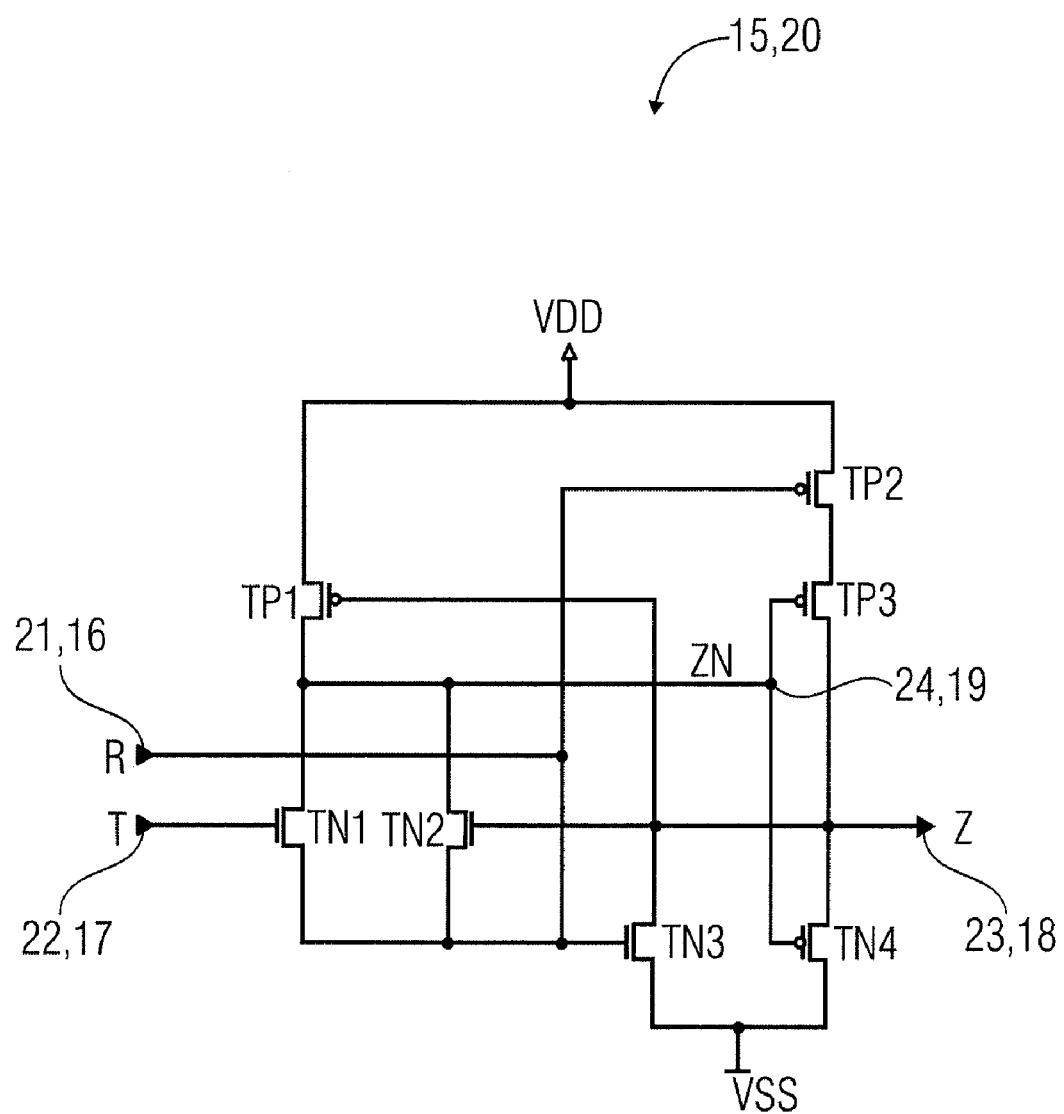
FIG. 2 shows a fault detection circuit for a storage circuit with fault detection according to an embodiment.

In FIG. 2, according to another embodiment, a fault detection circuit is shown. The first 15 and the second 20 fault detection circuit depicted in FIG. 1b could be, for example, the circuit shown in FIG. 2.

The fault detection circuit 15, 20 may be a flip-flop circuit comprising a first stable state and a second stable state, wherein each of the first 15 and the second 20 fault detection circuits is configured such that a fault signal strength necessary to cause switching from the first stable state to the second stable state is different from a fault signal strength necessary to cause switching from the second stable state to the first stable state.

The fault detection circuit may comprise a latch, for example, a reset-set latch wherein the first input 21, 16 may be a reset input for resetting the reset-set latch. The second input 22, 17 of the fault detection circuit may be a set input for setting a first or a second stable state of the latch. The first and the second fault detection circuit 15, 20 may further comprise at least a first output 19 and a second output 24 configured as a first output node for the first or the second stable state of the latch. The (reset-set) latch may be an asynchronous latch, wherein a change of data at the data input effect instantaneously a change of the first and second stable state at the output.

The fault detection circuit 15, 20 can be interpreted as a modified so-called reset latch (RS-latch) which may act as a bi-stable storage circuit, wherein the storage—or latch nodes are designated with Z and ZN. Furthermore, it should be noted that p-channel transistors and n-channel transistors are designated by TPX and TNX, respectively, X=1, 2, . . . in the following descriptions.

According to some embodiments, the fault detection circuit may be sensitive to at least one of the effects of ionization radiation and fluctuations of a supply voltage. In general, the fault detection circuit may be sensitive to a fault or disturbance. Such a fault or disturbance may occur because of a manipulation attempt, an error or an external attack. Such an attack may, for example, include the forcing of data or the probing of a signal or data. According to other embodiments, the fault detection circuit may comprise an unequal or unbalanced sensitivity, therefore, in case of an attack, e.g., the impact of an ionizing radiation or fluctuations of a supply voltage, the fault detection circuit may be more sensitive to switch from a first stable state to a second stable state than to switch from the second stable state to the first stable state. In other words, the fault detection circuit is formed such that a fault can cause a preferred combination of states at its outputs, indicating a fault.

In the following, the function of the digital fault detection circuit 15, 20 is explained. The supply voltage VDD may be considered as "high state" or "1" and the supply voltage VSS may be considered as "low state" or "0".

In FIG. 2 the setting of Z to VDD and the simultaneous resetting of ZN to VSS, may be achieved by means of an active, i.e. high state or VDD at the set input T if R is simultaneously inactive, i.e., equal to VSS. ZN is then connected via the conducting transistor TN1 to R=VSS. As a consequence Z is coupled to VDD via the conducting transistors TP2 and TP3. If T is then deactivated again, i.e., set to VSS, without activating R, i.e., R remains at VSS, then the state Z=VDD, ZN=VSS is conserved, since across the conducting transistors TP2, TP3 and TN2 a mutual feedback exists between Z and ZN. A resetting of Z to VSS and a simultaneous setting of ZN to VDD is achieved by applying a high level VDD to the reset input R, so that Z is coupled via TN3 to VSS or ground. As a consequence, the node ZN is coupled via the conducting transistor TP1 to VSS. The level of T at the set input may be irrelevant. If R is again deactivated, i.e. set to VSS, without activating T, i.e. T is at VSS, then the state Z=VSS, ZN=VDD is conserved, since across the conducting transistors TP1 and TN4 a mutual feedback exists between Z and ZN.

The state Z=0, ZN=1 achieved by this reset operation is then the state or the combination of states, which is particularly sensitive to attacks exploiting, for example, ionizing radiation or strong fluctuations of VDD-VSS. Such attacks may cause a state change to Z=VDD, ZN=VSS, even if the "intensities" of the respective attacks are still not sufficient enough to cause state changes in very sensitive attack targets, such as e.g., Static-Random-Access-Memory-cells (SRAM cells). This increased sensitivity of the fault detection circuit may be achieved by an unsymmetrical dimensioning of channel widths and channel lengths as well as the "drain regions" of some transistors within the fault detection circuit or the digital detector cell. Large channel lengths and/or small channel widths of transistors TP1, TN3, TN4 and small channel lengths and/or large channel widths of transistors TP2, TP3, TN1, TN2 and also enlarged "drain-regions" of TP3, TN1 and TN2 mean, on the one hand, a significant increase of negative charge transfers on ZN by ionizing radiation on TN1, TN2 compared with those on Z by ionizing radiation on TN3 and TN4. An analogous situation conversely holds true for a significant increase in positive change transfers on Z as a result of ionizing radiation on TP3 compared with those on ZN as a result of ionizing radiation on TP1. The "one-way toggle" of the state or combination of states Z=VSS, ZN=VDD to Z=VDD, ZN=VSS is further favored by the increase in the current yield of TP2, TP3, TN1 and the decrease in the current yield of TP1, TN3, TN4 as a result of the "skew dimensioning". These may also result in the effect that the fault detection circuit comprises a preferred state or a preferred combination of states. Hence, if the level the supply voltage is switched on and increased from VSS to the respective nominal supply voltage value VDD at which the circuits of the integrated circuit are operated, the state Z=VDD, ZN=VSS, i.e. the "alarm state" is always established. This property means that the fault detection circuit may have a significantly increased sensitivity to so-called spike attacks by means of large fluctuations of VDD-VSS compared to symmetrically dimensioned "attack targets", such as, for example, SRAM cells.

According to some embodiments, a fault detection circuit may comprise sub-circuits with a little increased sensitivity than the most sensitive targets of an attack. The most sensitive targets of an attack can be, for example, 6-transistor-SRAM cells or other circuits with a storage functionality, which may be, for example, formed in a static Complementary-Metal Oxide-Semiconductor (CMOS) circuit technology. According to some embodiments, the same physical effect can be exploited for the detection of an attack with ionizing radiation than for the attack itself. In case of the ionizing radiation, the physical effect of the attack is a charge carrier separation or a short circuit across pn-junctions driven in reverse direction, if these are exposed to ionizing, that means electron-hole pairs generating radiation. Such an electron-hole pairs generating radiation can be, for example, photons or alpha ($\alpha$)-particles.

The same is true for attacks by means of deliberate fluctuations of the supply voltage with the aim to erase a stored bit or to set a bit in a storage device, e.g. a SRAM-cell or a register. A setting of a bit may be possible for strong fluctuations in the range of the supply voltages VDD-VSS. According to some embodiments, the same physical effect for the detection of an attack is exploited then for the attack itself. This can be done by a digital fault detection circuit as it is, for example, shown in FIG. 2. Such a fault detection circuit may be configured to be as similar as possible compared to a circuit which is a possible attack target.

In some embodiments, the storage circuit 100 may comprise a first fault detection circuit 15 which is configured as a flip-flop, comprising a first stable state and a second stable state and wherein the first fault detection circuit comprises a first reset-set latch with a reset input 16 for resetting the first reset-set latch, with a set input 17 for setting the first latch and with the, at least, first output 19 which is configured as first output node ZN for the first or the second stable state of the first latch. The second fault detection circuit 20 may also be configured as a flip-flop, comprising a first stable state and a second stable state, wherein the second fault detection circuit comprises a second reset-set latch, with a second reset input 21 for resetting the second reset-set latch, with a second set input 22 for setting the second reset-set latch and with a second output 24 configured as first output node ZN for the first and the second signal state of the second latch.

The circuitry 10 (see FIG. 3) may be configured to apply a reset signal to a reset input 16 of the first reset-set latch 15 and not to apply a reset signal to a reset input 21 of the second reset-set latch 20 if a data signal having a first signal state is applied to the data input. Moreover the circuitry 10 may be configured to apply a reset signal to the reset input 21 of the second reset-set latch and not to apply a reset signal to the reset input 16 of the first reset-set latch, if a data signal having a second signal state is applied to the data input. A reset signal may be a signal state or signal level which effects a reset of the reset-set latch. If a signal state or signal level does not effect a reset of the reset-set latch, it is not a reset signal.

In another embodiment the circuitry 10 may comprise a first inverter 50 coupling a first output 18 of the first reset-set latch 15 to a second set input 22 of the second reset-set latch 20 and a second inverter 55 coupling an output 23 of the second reset-set latch to the set input 17 of the first reset-set latch. The first inverter 50 and the second inverter 55 are part of the circuitry 10 and may ensure that the second fault detection circuit assumes a different stable state then the first fault detection circuit. The inverter 50 and 55 may act as buffers to decouple the outputs from sensitive nodes of the circuit. The first output 18 and the second output 23 may correspond in some embodiments to the output node Z of the fault detection circuit in FIG. 2. A circuitry 10 of a storage circuit with fault detection may comprise a first inverter 50 coupled between a first output 18 of a first fault detection circuit 15 and a set input 22 of a second fault detection circuit 20. The first output 18 may correspond to the node Z of the fault detection circuit shown in FIG. 2 or to a node Z of a similar fault detection circuit. The circuitry 10 may furthermore comprise a second inverter 55 which is coupled between a second output 23 of the second fault detection circuit 20 and a set input 17 of the first fault detection circuit 15. The second output 23 may correspond to the node Z of the fault detection circuit shown in FIG. 2 or to a node Z of a similar fault detection circuit.

In other embodiments the first 19 and the second 24 output may correspond to the node ZN of a fault detection circuit shown in FIG. 2 or to a node ZN of a similar fault detection circuit. In this case the first inverter 50 and the second inverter 55 need not to be part of the storage circuit.

According to another embodiment, the first and second reset-set latch comprise each two output nodes ZN and Z. Both the first and the second reset-set latch may be configured to set opposite first and second states in a regular operation at the first and the second output node depending on the signals or states applied to inputs R, T of the first and the second reset-set latch. Each of the first fault detection circuit 15 and the second fault detection circuit 20 may comprise an unequal sensitivity for a fault upon an attack, an error or manipulation, so that in case of an attack or manipulation, the first fault detection circuit and the second fault detection circuit is more sensitive to switch from a first state to a second state than to switch from the second state to a first state. In other words a fault, upon an attack, an error or a manipulation of a digital fault detection cell may cause a preferred combination of states at its output. Depending on the implementation, the first state and the second state may be a high level, "1" or a low level, "0". This behavior may be achieved when the fault detection circuit, for example, the first fault detection circuit and the second fault detection circuit comprise transistors with at least one transistor comprising an unequal channel width or unequal channel length, so that an unequal sensitivity for an attack is achieved. In some embodiments the transistors of a fault detection circuit may comprise larger drain regions than regular transistors so that a photo-sensitivity of the transistors with respect to an attack by means of radiation is increased. The first fault detection circuit and the second fault detection circuit may comprise transistors with a different current yield, so that an unequal sensitivity for an attack is achieved and the first output of the first fault detection circuit and the second output of the second fault detection circuit are set in a predetermined state indicating a fault. In some embodiments, the first fault detection circuit and the second fault detection circuit may be sensitive to a fault, so that a fault is indicated at the first output of the first digital attack detection circuit and/or at the second output of the second digital attack detection circuit.

With respect to the structure and the functionality of the fault detection circuit shown in FIG. 2 and possible alternative fault detection circuits, reference is made to US 2007/0182575 A1 going back to the same inventor, the content of which is incorporated herewith by reference.

Figure 3:
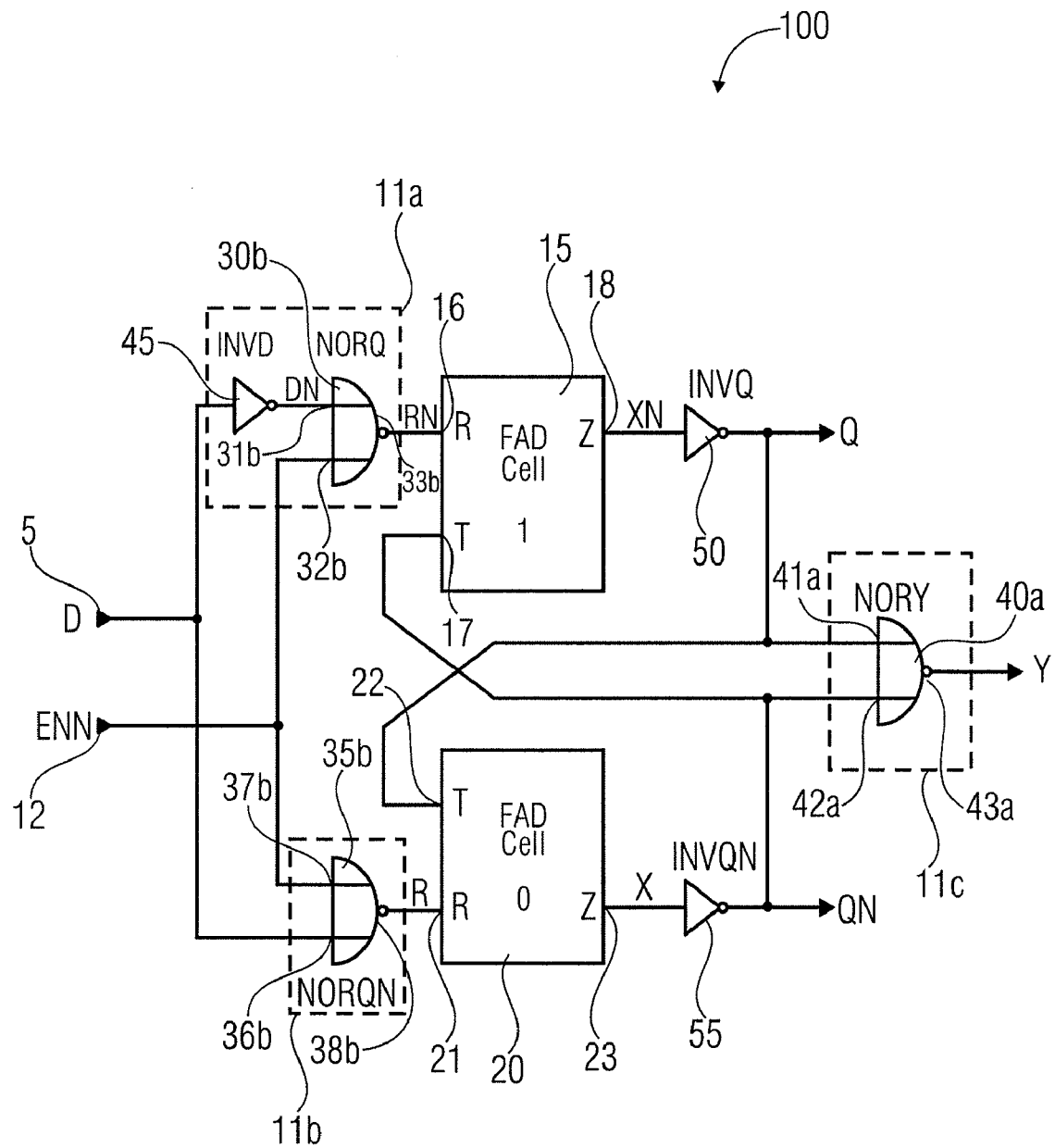
FIG. 3 shows a storage circuit with fault detection comprising a first fault detection circuit and a second fault detection circuit according to another embodiment.

FIG. 3 shows a storage circuit 100 with fault detection. In this embodiment, the storage circuit comprises, besides the elements which have been already described above, a third logic circuit 11c with a first input 41a, a second input 42a and an output 43a. The third logic circuit may comprise a NOR-gate, 40a or NORY. Moreover the first logic circuit 11a comprises a third inverter 45 coupled between the data input 5 and a first logic gate 30b or NORQ. The third inverter 45 may ensure the complementary function with respect to the stable states of the first and the second fault detection circuit. The storage circuit 100 may also comprise the first inverter 50 coupled between the first output 18 and the second set input 22. A second inverter 55 is coupled between the second output 23 and the set input 17. The first output 18 of the first fault detection circuit is also coupled via the first inverter 50 to the third logic circuit 11c. This also applies to the second output 23 which is coupled via the second inverter 55 to the third logic circuit 11c. In this embodiment, the first logic circuit 11a, the second logic circuit 11b and the third logic circuit 11c comprise a NOR-gate. The first logic circuit 11a may comprise a first NOR-gate, NORQ and a third inverter 45, wherein the third inverter 45 is coupled between the data input and a first input 31b of the first NOR-gate 30b. The second input 32b of the first NOR-gate is coupled to the enable input 12 and an output 33b of the first NOR-gate is coupled to the reset input 16 of the first reset-set latch 15 or fault detection circuit. The second logic circuit 11b comprises a second NOR-gate 35b, NORQN, wherein a first input 36b of the second NOR-gate 35b is coupled to the data input 5, a second input 37b of the second NOR-gate is coupled to the enable input 12 and the output 38b of the second NOR-gate is coupled to the reset input 21 of the second reset-set latch 20.

In several embodiments the third logic circuit 11c may be configured to output an alarm signal if signals which depending on the signal states at the first and second outputs indicate an invalid combination of signal states.

In general the circuitry 10 may comprise a first logic circuit 11a configured to provide the reset signal for the first reset-set latch 15 and a second logic circuit 11b configured to provide the reset signal for the second reset-set latch 20. A reset input of a fault detection circuit, for example the reset input 16 and 21, may be dominant against the respective set input of the fault detection circuit, for example the set input 17 and 22, i.e. if a reset signal is applied to the reset input the signal state at the set input is irrelevant.

In the following, the operation of the storage circuit 100 with fault detection is explained. In FIG. 3, among others the linking of the fault detection circuits 15,20 according to FIG. 2 is depicted. The first fault detection circuit 15 is also named Fault Attack Detection Cell (FAD cell 1) and the second digital attack detection circuit 20 is also named FAD cell 0. By applying the enable signal ENN=0 to the enable input 12 and data D=0 to the data input 5, the logic level at the output 38b of the second logic circuit 11b is R=1 and the logic level at the output 33b of the first logic circuit 11a is RN=0. As a consequence, the first "FAD cell 0" is reset by the reset signal at the second reset input R or 21. As described above, a resetting of the FAD cell can be achieved with a high level applied to the reset input 21 and as a consequence the logic level X is 0 at the second output 23 or Z. Hence, the logic state QN behind the third inverter 55 is 1. This logic state QN is coupled to the set input 17 of the FAD cell 1. This means the FAD cell 1 is set and hence, the logic level XN at the first output 18 goes to 1. Consequently the logic level Q=0 behind the first inverter 50. This corresponds to the data D which was applied to the data input 5.

For ENN=0, D=0, the data D at the data input 5 is written to the storage circuit 100 as long as the "low active write enable" ENN signal is at its active logic level 0. The storage circuit 100 may be formed among other by the inverters INVD, INVQ and INVQN, and by the NOR-gates, NORQ and NORQN, as well as by the two FAD cells ("FAD cell 0" and "FAD cell 1").

For ENN=0 and D=1 the state of RN is 1 and R at the reset input 21 is 0, and therefore the first "FAD cell 1" is reset, so that XN at the first output 18 becomes 0. As a consequence, Q becomes 1 and therewith the "FAD cell 0" is set. Hence, the logic level X at the second output 23 goes to 1 and QN becomes 0.

For ENN=0 and D=1, the storage data D at the data input 5 is written to the storage circuit 100 which comprises the inverters INVD, INVQ and INVQN and the NOR-gates, NORQ and NORQN as well as the FAD cells, "FAD cell 0" and "FAD cell 1", as long as the "low active write enable ENN signal" is at its active level 0. In this embodiment the enable signal ENN is 0, in other embodiments the enable signal ENN may be different, for example 1. The enable signal ENN may be a certain signal state or level applied to the enable input 12, which allows writing data, applied to the data input 5, to the storage circuit. The deactivation of the enable signal at the enable input 12, by applying a signal state different to the enable signal state may prevent writing of data applied to the data input 5 to the storage circuit.

For ENN=1 the level R=0 at the second reset input 21 and the level RN=0 at the reset input 16 are independent of the value or data D applied to the data input 5. This means that a logic level or a logic state which is written with a low active write enable signal ENN=0 to the storage circuit is stored or held. The logic levels or the states of X, XN, Q and QN do not change if the enable signal ENN=1. In this case the enable input 12 is disabled. In other words, as long as an enable signal ENN=0 is applied to the enable input 12 data D which are applied to the data input 5 can be written to the storage circuit 100. By disabling or deactivating the enable signal at the enable input 12, that means in this embodiment by changing the enable signal ENN=0 to ENN=1, a storing of the data D, previously written to the storage circuit can be achieved. If ENN=1, then the following expressions are valid XN=not(X) and QN=not(Q). For both of the above described write processes, that means if ENN=0, it is true, that the values or states of X, XN, Q and QN do not change, if the already stored value of X or Q (before the write process) agrees with the value or logic state which is applied during ENN=0 to the data input 5. However, if during ENN=0, the value or logic state which is applied to the data input 5 does not agree with the stored value or stored logic state before the write process to X or Q, the following sequences can occur at the node pairs (X,XN) and (Q,QN).

If a previously stored 0 is overwritten with a 1, the node pair (X,XN) is (0,1) and changes first to (0,0) and then to (1,0) and the node pair (Q,QN) is (0,1) and changes first to (1,1) and then (1,0).

If a previously stored 1 is overwritten with a 0, the node pair (X,XN) is (1,0) and changes first to (0,0) and then to (0,1) and the node pair (Q,QN)=(1, 0) changes first to (1,1) and then to (0,1).

Since data D, which are applied to the data input 5 may change several times during ENN=0 also the above described sequences at the node pairs (X,XN) and (Q,QN) can occur several times one after the other. During the described regular operation of the storage circuit 100, the combination of states (X,XN)=(1,1) or (Q,QN)=(0,0) cannot appear, not even shortly, since, as is described above, during a write process which causes a change of stored data, first one of the both FAD cells is reset, before the complementary FAD cell can be set.

However, in case of a fault, for example, upon a successful attack these states or combination of states can be achieved. To give an explanation, it is first assumed, without any restriction, that ENN=1, i.e. the latch comprises the state in which previously written data should be held. Furthermore, first attacks on sub-circuits of the storage circuit shall be considered. Attacks on the data—and control signal inputs D and ENN will be discussed later.

Then, in case ENN=1, within the reset-set latches following attack targets come into consideration. Both FAD cells or fault detection circuits 15,20, that means "FAD cell 0" and "FAD cell 1", the NOR-gates, NORQ and NORQN, as well as the inverters INVQ and INVQN.

Without any restriction, it is now assumed, that before an error attack takes place a 0 is stored on the storage circuit. Then, (X,XN)=(0,1) and (Q,QN)=(0,1) is valid and because of ENN=1 is R=0 and RN=0 too. A further consequence of this assumption is that the "FAD cell 0" comes as a possible target into consideration, since "FAD cell 1" is already on "alarm". This means the FAD cell 1 is set to the more stable signal state, as it is described in context to FIG. 2, and which FAD cell 1 cannot leave or change because of an error attack. A successful attack on "FAD cell 0" causes X to change to 1, out of which the (stable) state (X,XN)=(1,1) or (Q,QN)=(0,0) arise. This is exactly the combination of states which do not occur during a regular operation, as described above. This alarm of the storage circuit can now be indicated, for example, by the value Y=1 at the output 43a of the NOR-gate, NORY of the third logic circuit 11c. Since, Y=NOR (Q,QN), Y can only for (Q,QN)=(0,0) assume the value 1.

As a further consequence of the assumption that before an error attack (X,XN)=(0,1) and (Q,QN)=(0,1), NORQ can be considered as possible attack target. A successful attack on the logic gate NORQN of the second logic circuit 11b would mean that R assumes shortly the value 1 at the second reset input 21, if ENN=1. This would cause a falling edge of the alarm signal Y at the output 43a of the third logic circuit 11c. But this would be ineffective in this case since Y is already in the state 0.

A successful attack on NORQ of the second logic circuit 11b means that RN assumes at least shortly the value or the logic state 1 which causes the following sequences at the node pair (X,XN). The node pair (X,XN)=(0,1) and changes first to (0,0) and then to (1,0) and the node pair (Q,QN)=(0,1) changes first to (1,1) and then to (1,0). But these sequences are exactly the sequences during a regular operation of overwriting a previously stored 0 with a 1. In this case, a successful attack may initially not be indicated by the alarm signal state Y=1 at the output 43 of the third logic circuit 11c. As it is described later, such an attack may be prevented or recognized if the logic gate NORY is physically arranged between NORQ and NORQN.

Regarding attacks during ENN=0, that means if the storage circuit is enabled to receive data to be stored, it is first of all sufficient to consider a short time period before the rising edge, when ENN goes to 1, since with this edge the write process is finished. This means that the same considerations are valid as described above. Successful attacks on one of the both fault detection circuits or "FAD cells" are indicated by the value or alarm signal state Y=1 at the output 43 of the NOR-gate NORY. A successful attack on the logic gates NORQ or NORQN will be indicated at the output 43 by at least a short pulse, as will be explained below.

Attacks on the data—and control signal inputs 5 and 12, should be detected and prevented as well, in order to increase the protection against error attacks. According to some embodiments, the data D and the enable signal ENN are generated in circuit networks, so-called combinatorial logic circuits, while the nodes of the storage circuit, e.g. Z and ZN in FIG. 2 which are sensitive against error attacks, are mutually bi-stable coupled. This means that a change of the state of one of these nodes, which is caused by a fault, for example, upon an error attack, can not only change the respective state of the other node, but rather this change ensure that the state changes, which are caused by the error attack, remain temporal stable. The latter may be different in combinatorial logic circuits. The change of the state of an output node of a logic gate, by means of, for example, a laser-pulse targeted on a logic gate lasts only marginally longer than the laser pulse itself. Afterwards, the node returns to its original state which may only depend on the values of the input signals of the logic gate. Thereby, it is assumed that the input signals of the logic gate either have not been changed by the error attack or are returned in their original states and, therefore, may not be part of storage circuits which are protected against an attack.

These may now mean that data signal nodes within circuit networks, e.g. D, are less sensitive to attacks, since an attack should take place at "the exact right moment" in order to write the values, which shall be changed by the error attack, to the nodes which are forming the connection between the circuit network and the storage circuit. The change of the values by the error attack should appear as long as the storage circuit can receive or is "open" to new data.

Furthermore, nodes within a circuit network may comprise usually a significant higher capacitance (order of magnitude 10 times or more) than the feedback nodes within a storage apparatus. This requires a substantial higher intensity, e.g., for a laser radiation for a successful error attack. Furthermore, this may mean that considerably less sensitive detector circuits which are relatively far away arranged from the areas which are affected by the error attacks, can detect or recognize such error attacks.

All clock or timing signals for the storage circuit or storage apparatus may be more susceptible to error attacks. Such a susceptible clock or timing signal may be, for example, ENN. The enable signal which may be applied to the enable input of a storage circuit may be a clock—or timing signal. The enable signal may be considered as a clock signal or timing signal which is clocking the storage circuit and the fault detection circuit therein. Each "not planned"—even a very short change of the state of such a clock or timing signal may cause that data in the respective storage apparatus are overwritten wrongly or do not arrive there.

Figure 4:
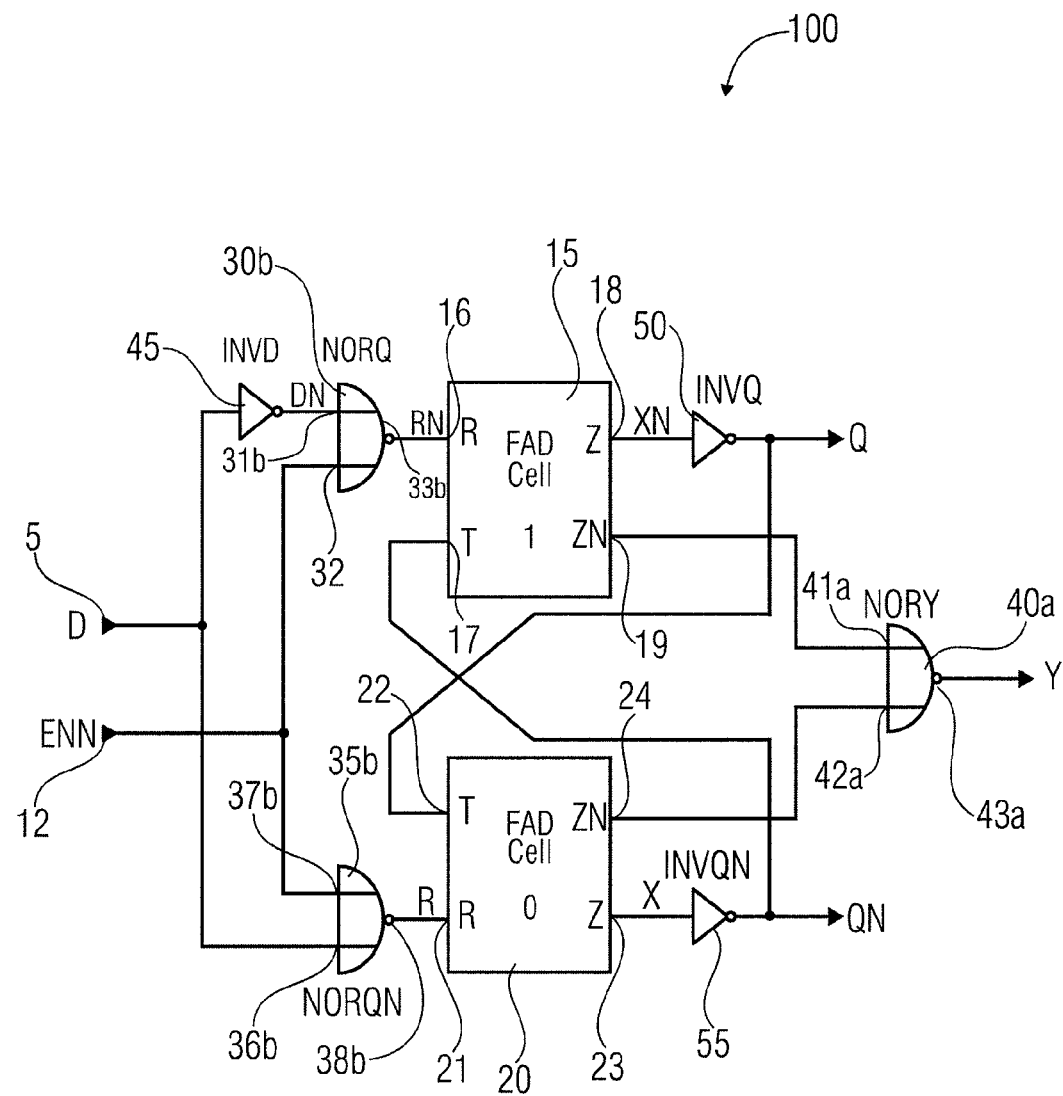
FIG. 4 shows another storage circuit with fault detection, wherein the digital fault detection circuit comprises two outputs according to another embodiment.

FIG. 4 shows another embodiment of a storage circuit 100 with fault detection. In this embodiment, the first 15 and the second 20 fault detection circuit comprise each a second output 19 and 24. This means the fault detection circuits or the FAD cells make use of a second output node as it is shown in FIG. 2 as well. In this embodiment, the signal state ZN at the second output 19 of the FAD cell is used for the generation of the alarm signal Y at the output 43 of the third logic circuit 11c. Depending on the physical realization and the used process technology of the storage circuit, an increased robustness or an improved error or attack detection can be achieved. Other elements with the respective reference numerals in FIG. 4 are already described above.

Figure 5:
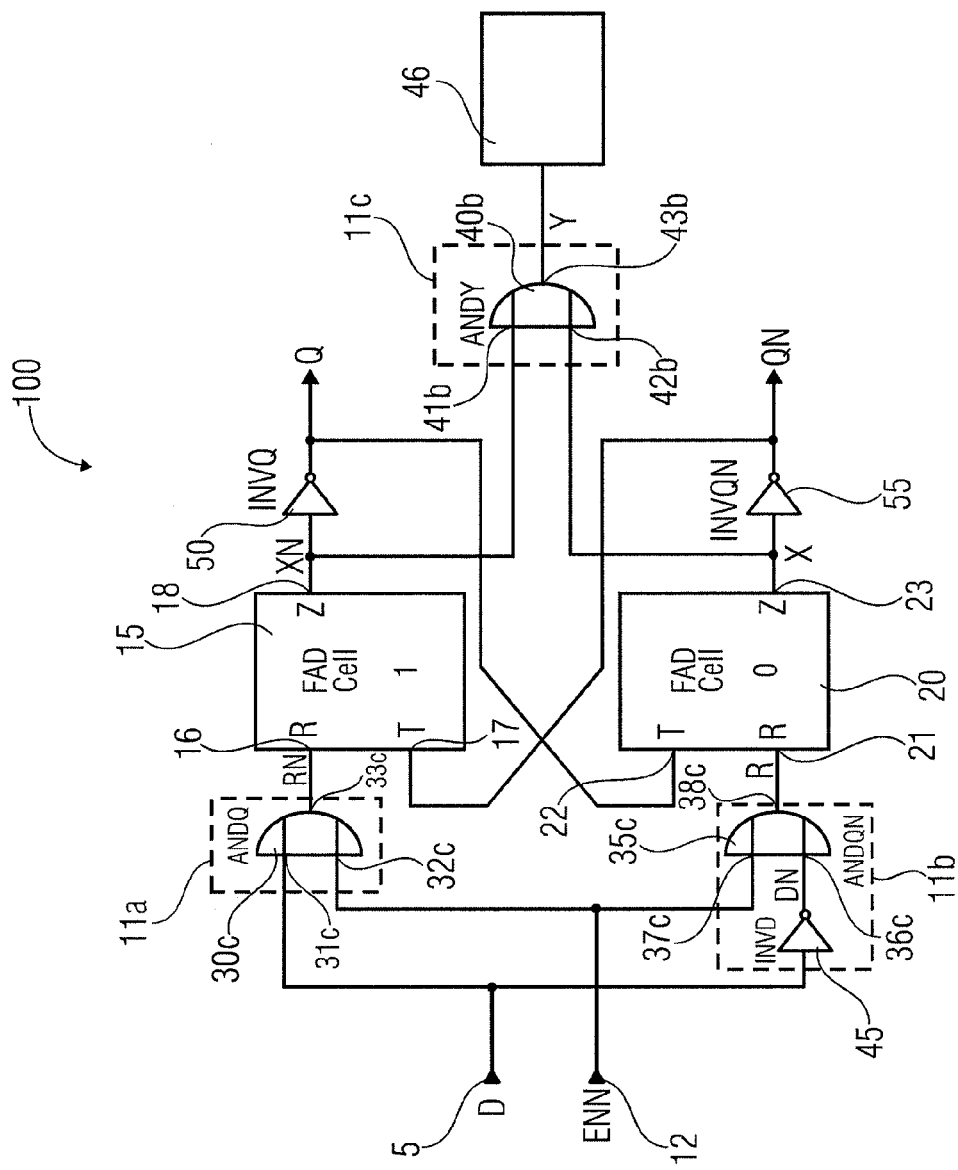
FIG. 5 shows a storage circuit with fault detection, wherein the storage circuit comprises AND-logic gates according to another embodiment.

It is obvious that other possibilities do exists to realize a storage circuit with fault detection within the scope of the disclosed embodiments. In FIG. 5, for example, another embodiment of a storage circuit 100 with a fault detection is depicted. In this embodiment, instead of a "low active enable signal" ENN=0 for enabling the writing of data to the storage circuit, as described in context to the FIG. 3 a "high active enable signal" ENL=1 is used. Accordingly, the gates NORQ and NORQN in FIG. 3 are replaced by the AND-gates ANDQ and ANDQN in FIG. 4. Furthermore, the alarm signal Y at the output 43b of the third logic circuit 11c is no longer generated with the NORY-gate by the logic combination of Q and QN, but rather with an AND-gate, namely the ANDY-gate, and the logic combination of the signal states X and XN. Depending on the exact physical realization and the used process technology such a circuit arrangement may achieve a higher robustness and improved fault recognition compared to the storage circuit shown in FIG. 3. In FIG. 5 a further alarm storage circuit 46 is shown. In this embodiment the output 43b of the ANDY-gate may be coupled to the alarm storage circuit 46, which may be configured to store and/or to process the alarm signal Y for further purposes. Such an alarm storage circuit 46 may be, for example, another fault detection circuit, as described in context to FIG. 2, which may be then used to store information concerning an alarm.

According to this embodiment the first logic circuit 11a comprises a first AND-gate, ANDQ, wherein a first input 31c of the first AND-gate is coupled to the data input and wherein a second input 32c of the first AND-gate 30c is coupled to the enable input. An output 33c of the AND-gate is coupled to the reset input of the first reset-set latch or first fault detection circuit. The second logic circuit 11b may comprise a second AND-gate 35c, ANDQN, and an inverter 45, wherein the inverter 45 is coupled between a first input 36c of the second AND-gate and the data input. A second input 37c of the AND-gate is coupled to the enable input 12 and the output 38c of the AND-gate is coupled to the reset input of the second reset-set latch. In other embodiments the first logic circuit 11a, the second logic circuit 11b and the third logic circuit 11c can comprise, for example, at least one of the NOR-, NAND-, AND-, OR-gates. This means that in other embodiments the used logic gates in the logic circuits 11a,b,c may be different to those depicted in FIG. 3, 4 or 5.

Figure 6:
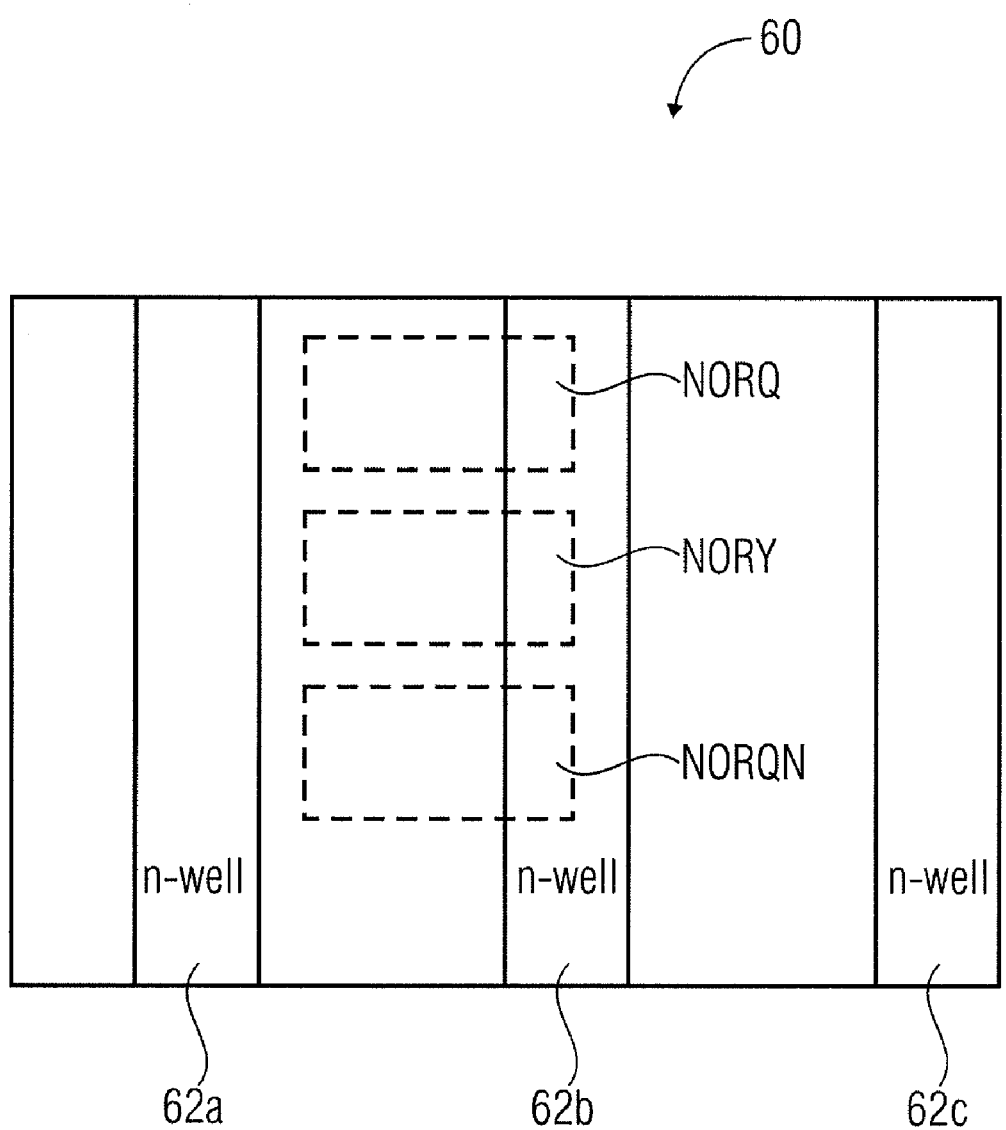
FIG. 6 shows the schematic top view of a semiconductor substrate comprising the NORQY-, NORQ- and NORQN-gate of a storage circuit according to an embodiment.

An attack on the NORQ gate may be hard to detect since the sequences which are triggered in the fault detection circuit are identical to those during a regular operation for overwriting a previously stored 0 with a 1. In this case, a successful attack may not indicated initially by a value Y=1 at the output 43b but such a successful attack may be prevented, if the NORY gate is physically arranged between the NORQ and the NORQN gates. This is schematically shown in the top view FIG. 6. In FIG. 6, the storage circuit may be formed in a substrate 60 wherein, for example, a p-type semiconductor substrate comprises n-well zones 62a,b,c. P-channel transistors which are used to realize the NORQ, NORY and NORQN may be arranged in the n-well zones of the semiconductor substrate 60 and n-channel transistors may be arranged in the p-type semiconductor substrate. As it is shown schematically in FIG. 6, the NORY gate transistors may be physically arranged between the transistors which are forming the NORQ and NORQN-gates.

A successful attack, for example, on the NORQ gate means that the state RN may assume for a sufficiently long time period the value 1, in order to reset the "FAD cell 1". But this means, that the p-channel transistors forming the NORQ gate or at least one of the drain-diffusion regions or the n-well, in which the p-channel transistors are arranged, are influenced by the attack, so that a n-channel transistor in the NORQ, which is switched in a conductive state by ENN=1 is either overdriven or/and that the conductivity of this n-channel transistor is affected by the attack.

If now the NORY-gate with its transistors is physically directly besides, close to or between the NORQ and NORQN-gates and their respective transistors arranged, the above mentioned consideration are also valid for the NORY gate. This means, that the signal state Y at the output 43b assumes at least shortly the value 1, for a sufficiently long time period, to write the information that an attack was detected to an attack detection circuit 46, e.g., a further "FAD cell".

Additional measures to increase the protection against an attack and to detect successful attacks on the logic gates NORQ and NORQN may include, dimensioning the relevant p-channel transistors in the NORQ- and the NORQN-gate in a proper "weak" manner with regard to the channel widths and the diffusion regions. Furthermore, the relevant n-channel transistor in the NORQ and NORQN-gate can be properly "strong" dimensioned, while for the NORY-gate the opposite measure can be performed. This means, the p-channel transistors can be properly "strong" dimensioned and the n-channel transistors can be properly "weak" dimensioned.

It should be noted, that the above mentioned arrangement of the NORQ, NORQN and NORY gates in the semiconductor substrate and the respective dimensioning of the channel lengths, channel widths and the diffusion regions of the transistors forming the NOR-gates can be adapted to the ANDY, ANDQ and ANDQN gates as well according to other embodiments. The same may be applicable to other logic gates forming the first logic circuit 11a, the second logic circuit 11b and the third logic circuit 11c.

Additionally, it is also possible to arrange well terminals or connections, e.g., a VSS terminal for a p-substrate or a p-well and a VDD terminal for an n-well, suitably close to the transistors which are endangered by an attack in order to make these endangered transistors robust against fault attacks.

According to some embodiments, the storage circuit may comprise a semiconductor substrate 60 and transistors forming the first logic circuit 11a, the second logic circuit 11b and the third logic circuit 11c. The transistors which form the third logic circuit 11c are arranged between or neighboring to the transistors forming the first 11a and the second 11b logic circuit in the semiconductor substrate 60. The storage circuit may comprise transistors of a first type of conductivity forming the first and the second logic circuit, wherein a transistor of the first type of conductivity comprises a channel dimension resulting during regular operation in a lower current yield than a transistor of the second type of conductivity of the first and the second logic circuit and wherein a transistor of the first type of conductivity of the third logic circuit comprises a channel dimension resulting during operation in a higher current yield than the transistor of the second type of conductivity of the third logic circuit. Transistors which are comprise a first type of conductivity may be one of the n-channel or p-channel transistors and transistors which comprise a second type of conductivity may be the other one of the n-channel or p-channel transistors. Moreover the storage circuit may comprise transistors with enlarged drain regions compared to regular transistors. This may result in a higher photo-sensitivity against a fault attack by means of a radiation. More free electron-hole pairs can be generated by a sufficient radiation if the drain region is enlarged and therewith the sensitivity may be increased.

In other embodiments, the storage circuit 100 may comprise transistors forming the first, the second and the third logic circuit. The transistors may be arranged close to or neighboring to the potential terminals of the p-doped or n-doped regions in which the transistors in the semiconductor substrate are arranged. The first 11a, the second 11b and the third 11c logic circuit may comprise transistors of different doping types, wherein in the first and second logic circuit, transistors of a first doping type are dimensioned to obtain a higher current yield than transistors of a second doping type. In the third logic circuit, transistors of the second doping type may be dimensioned to obtain a higher current rate than transistors of the first doping type. A first doping type may be one of p-type doping or n-type doping and a second doping type may be the other one of p-type or n-type doping.

In an integrated circuit, for example, for security applications, additional light and spike sensors may be integrated, which may be formed as analog circuits, which are designed to protect the whole integrated circuit or at least a large region of the integrated circuit against a fault by means of, for example, ionizing radiation or deliberate fluctuations of the supply voltage.

According to embodiments, the storage circuit with fault detection can also be used for protecting single small sub-circuits against local attacks. The functional principle of such analog circuits may make use of different physical effects, as they are also applied for error attacks to digital circuits, e.g. static CMOS gates, in order to achieve the desired malfunction of the digital circuit. Therefore, it might be difficult to detect, with a sufficient probability, a local attack on single, small sub-circuits of an integrated circuit by using such analog circuits alone.

Figure 7:
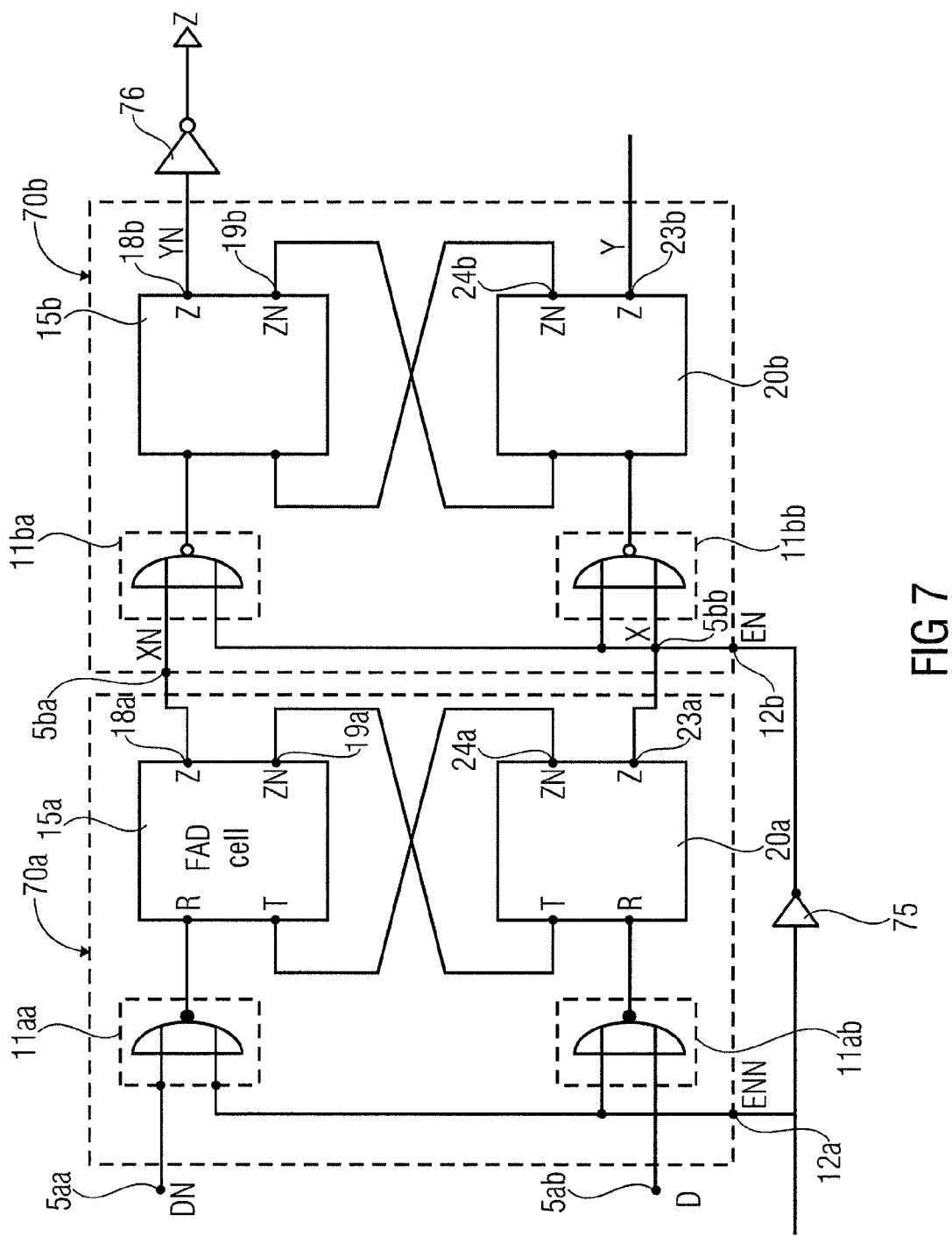
FIG. 7 shows a schematic master-latch circuit coupled in series to a slave-latch according to another embodiment.

In FIG. 7, a further embodiment is shown. In this embodiment, latches or fault detection circuits are connected to form registers, for example, a master-slave flip-flop. For that purpose two storage circuits with their respective fault detection circuits may be coupled in series, wherein the data outputs of the so-called master-latch is coupled to the data input of the slave-latch. A clock—or timing signal for the slave-latch may be the inverted clock—or timing signal for the master-latch. Such a clock signal or timing signal may be the enable signal.

The storage circuit 100 in FIG. 7 comprises a master-latch 70a and a slave-latch 70b. The master-latch comprises data inputs 5aa and 5ab, an enable input 12a, as well as a first fault detection circuit 15a and a second fault detection circuit 20a. The first digital fault detection circuit 15a comprises a reset input, a set input and a first output 18a and a second output 19a. The second fault detection circuit 20a comprises a second reset input, a second set input and two outputs 24a and 23a. Furthermore the master-latch may comprise a first logic circuit 11aa and a second logic circuit 11ab with the respective inputs and outputs as described above. In the embodiment shown in FIG. 7, the first and the second logic circuit may comprise a NOR-gate. In other embodiments the first and the second logic circuit may comprise a AND-gate or other logic gates. The first fault detection circuit 15a and the second fault detection circuit 20a can be cross-coupled via the outputs 19a and 24a.

The outputs 19a and 24a may correspond to the node ZN and the outputs 18a and 23a may correspond to the node Z of the fault detection circuit shown in FIG. 2 or to a similar fault detection circuit. That means that the output 19a of the first fault detection circuit 15a is coupled to the set input of the second fault detection circuit 20a and the output 24a of the second fault detection circuit is coupled to the set input of the first fault detection circuit. The master-latch may be configured to output a first combination of states at the outputs 18a and 23a indicating stored data and a second combination of states of the first and second output indicating a fault. The outputs 18a and 23a are coupled to the data inputs 5ba and 5bb of the slave-latch 70b. According to other embodiments the master-latch and the slave-latch may comprise one output as described, for example, in context to FIG. 3.

The slave-latch 70b may comprise a first data input 5b and a second data input 5c, an enable input 12b, a first fault detection circuit 15b and a second fault detection circuit 20b. The slave-latch may further comprise a first logic circuit 11ba and a second logic circuit 11bb. In the embodiment shown in FIG. 7, the first and the second logic circuit may comprise a NOR-gate. In other embodiments the first and the second logic circuit may comprise AND-gates or other logic gates. The slave-latch 70b may comprise a first digital fault detection circuit 15b which comprises a reset input, a set input, a first output 18b and a second output 19b. The second fault detection circuit 20b comprises a second reset input, a second set input and two outputs 24a and 23a. The slave-latch output 19b and the second slave-latch output 23b are cross-coupled to the set inputs T of the first 15b and second 20b fault detection circuit of the slave-latch. The signal state YN at the output 18b can be coupled to an inverter 76.

An enable signal ENN which is applied to the master-latch may act as clock—or timing signal for the master-latch. The enable signal ENN may be inverted by means of an inverter 75 and may be then applied to the slave latch. The inverted enable signal EN is then applied to the slave latch. Therewith it is ensured that only one of the two latches—the master-latch or the slave-latch can receive data. In other words at the same time only one of the two latches can be active, i.e. can receive data.

According to an embodiment, the master-latch and the slave-latch are connected in series, wherein the first output 18*a* of the master-latch 70*a* is coupled to the data input 5*ba* of the slave latch and the second output 23*a* of the master-latch 70*a* is coupled to the second data input 5*bb* of the slave-latch 70*b*. In other words, the output 18*a* of the master-latch is coupled to the first data input 5*ba* of the slave-latch and the second output 23*a* of the master-latch is coupled to the second data input 5*bb* of the slave-latch 70*b*. Furthermore the enable input 12*a* of the master-latch may be adapted to receive an enable signal ENN and the enable input 12*b* of the slave-latch may be adapted to receive the inverted enable signal ENN of the master latch so that only one of the master-latch or slave-latch is active. This means a clock signal or timing signal EN arriving at the slave-latch may be the inverted clock-signal or timing-signal ENN which is applied to the master-latch and which is fed to the enable input 12*a* of the master-latch and after an inversion by means of an inverter 75 to the enable input 12*b* of the slave-latch. If the enable signals of the master- and slave-latch, which act as clock signal or timing signal do not overlap, it may be ensured that only one of the flip-flops, the master-latch or the slave-latch accepts data. As a consequence, input data need not directly influence the data at the slave-latch outputs 18*b* and 23*b*. Therefore, the master-slave flip-flop can receive data at the data inputs 5*aa* and 5*ab*, while at the same time, the combination of states at the slave-latch outputs 18*b* and 23*b* are retained.

Some embodiments show a storage circuit 100 with fault detection, wherein the storage circuit is configured to receive storage data, which are applied to the data input depending on an enable signal applied to the enable input. Furthermore, the storage circuit may be configured to store the data depending on the deactivation of the enable signal or on applying a disable signal to the enable input. Data which are stored into the storage circuit may appear at the outputs 18 and 23 and hence can be read. During receiving data, which are applied to the data input of the storage circuit one of the first or second output of the first or second fault detection circuit may be set to a reset state and based on the reset state, the second of the first or second output is set to stored data.

During a regular operation, that means an operation without a fault, the first output of the storage circuit may comprise the opposite state as the second output. A first combination of signal states may refer to a combination of states, which can be achieved if the storage circuit works in a regular manner that means during a regular operation without a fault for example, upon an attack, an error or a manipulation attempt.

According to some embodiments, the storage circuit 100 comprises, as described above, a first logic circuit and a second logic circuit. The first logic circuit and the second logic circuit may be configured to cause a reset of the first fault detection circuit or a reset of the second fault detection circuit upon a fault so that a first or second stable state is set at the first output of the first fault detection circuit or at the second output of the second fault detection circuit.

Figure 8:
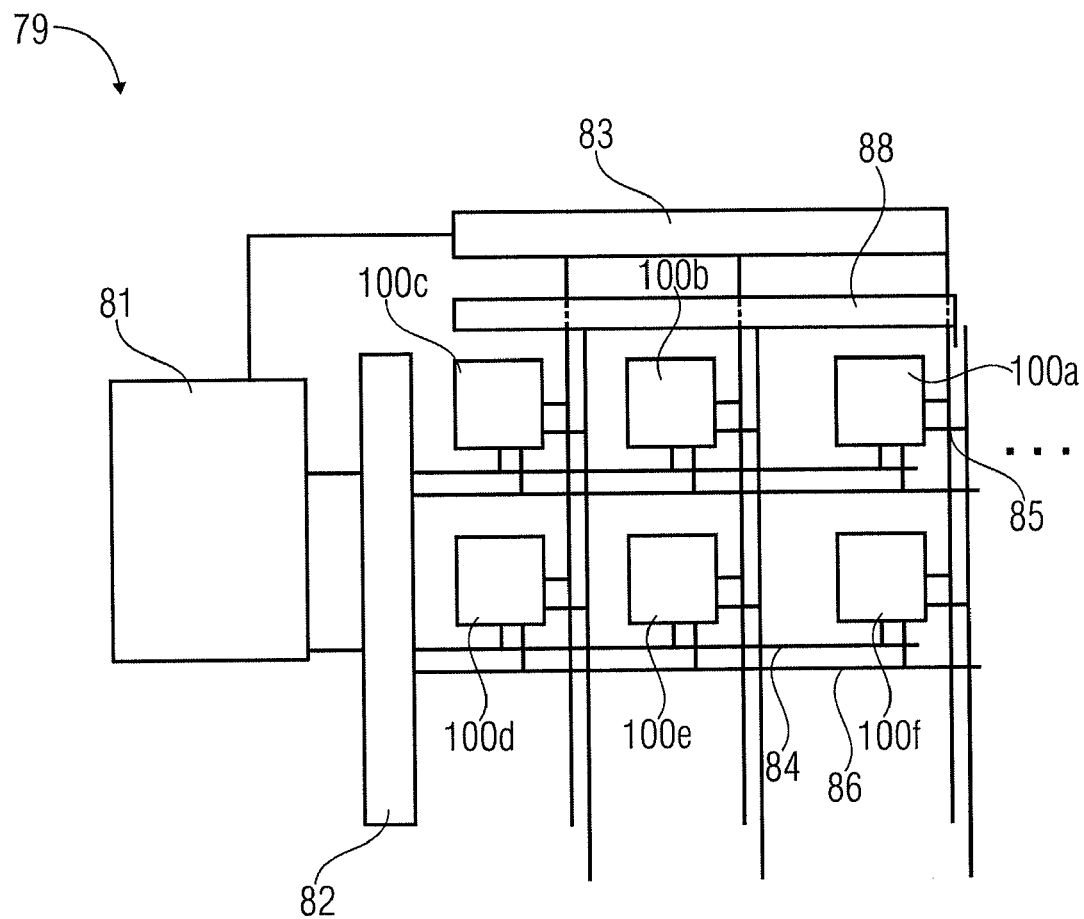
FIG. 8 shows a memory device with a plurality of storage circuits with fault detection according to an embodiment.

In another embodiment shown in FIG. 8, a memory device 79 may comprise a plurality of storage circuits 100*a,b,c,d,e,f* with fault detection. The storage circuits 100*a,b,c,d,e,f* may be formed as described in embodiments herein. The memory device 79 may further comprise a memory controller 81 configured to control storing of data into the storage circuit and reading data from the storage circuit. This may be done by means of control lines 84, 85, 86 and 87, which may be coupled to the enable input, the data input, the alarm output and the data output of each storage circuit. Some storage circuits with fault detection may be combined in groups and each read or store access to a group may be controlled by the memory controller.

According to embodiments the plurality of storage circuits with fault detection may be arranged in rows and columns. The memory device may further comprise a row decoder 83 a column decoder 82, which are configured to select a storage circuit or a group of storage circuits upon an address provided by the memory controller. A memory device may comprise a memory controller 81 and a plurality of storage circuits with fault detection, as described above and a monitor circuit 88, configured to evaluate the alarm signals of read data. The circuitry of each of the plurality of storage circuits with fault detection may be configured to output an alarm signal if signal states at the first and second outputs indicate a fault. Each storage circuit or group of storage circuits may comprise a (memory-) address, which may be defined, for example, by its position in a row and a column. The memory controller may be configured to control the storing of data into a storage circuit by applying the data to be stored to the data input of a storage circuit and the enable signal at the enable input of a storage circuit. The memory controller may further be configured to control reading of stored data from a storage circuit or a group of storage circuits of the memory device and it may comprise means to detect an alarm, for example, an alarm detection unit, which is configured to monitor the combination of signal states appearing at the first and the second output of a storage circuit or a group of storage circuits upon a read access. If an invalid combination of signal states upon a fault appears, it may alert a user of the memory device. Alternatively the alarm detection unit may monitor the state of the alarm signal Y of a storage circuit or a group of storage circuits upon a read access.

Figure 9:
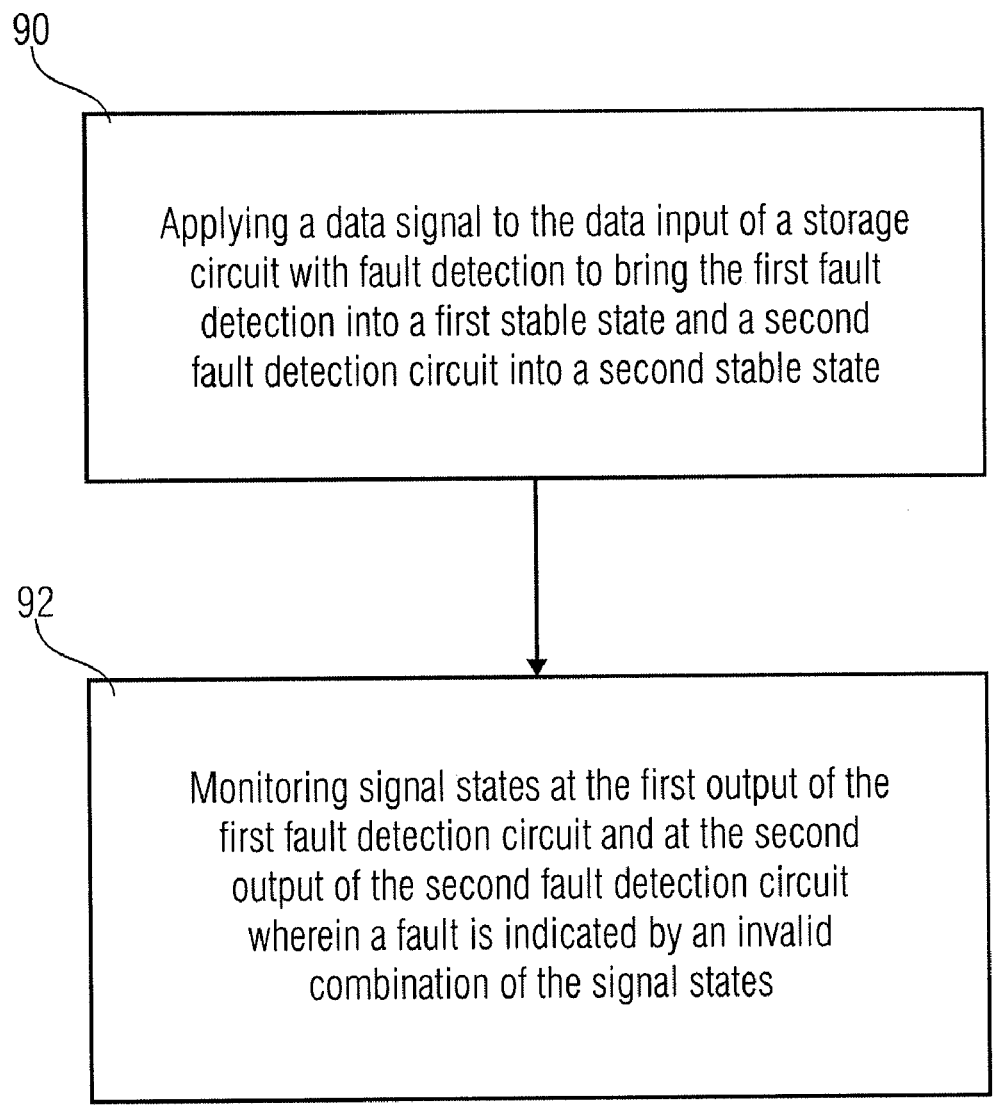
FIG. 9 shows a flow chart of the method for operating a storage circuit with fault detection.

In FIG. 9, a flow chart of an embodiment for the method of operating a storage circuit with fault detection is shown. The storage circuit may comprise a data input, a first and a second fault detection circuit, each comprising a first stable state and a second stable state, wherein each of the first and the second fault detection circuits is configured such that a fault signal strength necessary to cause switching from the first stable state to the second stable state is different from a fault signal strength necessary to cause switching from the second stable state to the first stable state. The storage circuit with fault detection may furthermore comprise a first output of the first fault detection circuit indicative of the state of the first fault detection circuit and a second output indicative of the state of the second fault detection circuit.

The method for operating the storage circuit may comprise applying 90 a data signal to the data input to bring the first fault detection circuit into the first stable state and the second fault detection circuit into the second stable state and monitoring 92 signal states at the first output of the first fault detection circuit and at the second output of the second fault detection circuit, and wherein an invalid logic combination of the signal states at the first and second outputs indicate a fault and a valid logic combination of the signal states at the first and second outputs indicate valid stored data.

In another embodiment the method may further comprise logically combining of the signal states at the first and second outputs and outputting an alarm signal if an invalid logic combination at the first and the second outputs indicates a fault. Moreover in a further embodiment the method may comprise applying an enable signal to an enable input of the first and second fault detection circuits, wherein the states of the first and second fault detection circuits can be changed, by applying a data signal to the data input, when the enable signal is applied. This means if an enable signal is applied to the enable input, data which are applied to the data input can be written to the storage circuit. Hence, a write access to the storage circuit may be controlled by the enable signal.

While this invention has been described in terms of several embodiments, there are alterations, permutations and equivalents, which fall within the scope of this invention. It should also be noted that there are many alternative ways of implementing the storing circuit with fault detection, performing the methods and implementing compositions of the present invention. It is therefore intended that the following appended claims be interpreted as including all such alternations, permutations and equivalents as falling within the true spirit and the scope of the present invention.

The invention claimed is:

1. A storage circuit with fault detection, comprising:
   first and second fault detection circuits each comprising a first stable state and a second stable state, wherein each of the first and the second fault detection circuits is configured such that a fault signal strength necessary to cause switching from the first stable state to the second stable state is different from a fault signal strength necessary to cause switching from the second stable state to the first stable state;
   a data input;
   a circuitry configured to cause the first fault detection circuit to assume the first stable state and the second fault detection circuit to assume the second stable state to store a data signal applied to the data input; and
   a first output indicative of the state of the first fault detection circuit and a second output indicative of the state of the second fault detection circuit, wherein an invalid combination of the signal states at the first and second outputs indicates a fault,
   wherein the first fault detection circuit comprises a first reset-set latch and wherein the second fault detection circuit comprises a second reset-set latch, and
   wherein the circuitry comprises a first inverter coupling an output of the first reset-set latch to a set input of the second reset-set latch and a second inverter coupling an output of the second reset-set latch to a set input of the first reset-set latch.

2. The storage circuit with fault detection according to claim 1, further comprising an enable input, wherein the circuitry is configured to allow storage of a data signal applied to the data input if an enable signal is applied to the enable input and to prevent storage of the data signal applied to the data input if the enable signal is not applied to the enable input.

3. A storage circuit with fault detection-, comprising:
   first and second fault detection circuits each comprising a first stable state and a second stable state, wherein each of the first and the second fault detection circuits is configured such that a fault signal strength necessary to cause switching from the first stable state to the second stable state is different from a fault signal strength necessary to cause switching from the second stable state to the first stable state;
   a data input;
   a circuitry configured to cause the first fault detection circuit to assume the first stable state and the second fault detection circuit to assume the second stable state to store a data signal applied to the data input; and
   a first output indicative of the state of the first fault detection circuit and a second output indicative of the state of the second fault detection circuit, wherein an invalid combination of the signal states at the first and second outputs indicates a fault,
   wherein the first fault detection circuit comprises a first reset-set latch and wherein the second fault detection circuit comprises a second reset-set latch, and
   wherein the circuitry is configured to apply a reset signal to a reset input of the first reset-set latch and not apply a reset signal to a reset input of the second reset-set latch if a data signal having a first signal state is applied to the data input, and is configured to apply a reset signal to the reset input of the second reset-set latch and not apply a reset signal to the reset input of the first reset-set latch if a data signal having a second signal state is applied to the data input.

4. The storage circuit with fault detection according to claim 3, further comprising an enable input, wherein the circuitry is configured to apply the respective reset signals only when an enable signal is applied to the enable input.

5. The storage circuit for fault detection according to claim 4, wherein the circuitry comprises a first logic circuit configured to provide the reset signal for the first reset-set latch and a second logic circuit configured to provide the reset signal for the second reset-set latch.

6. The storage circuit with fault detection according to claim 5, wherein the first logic circuit comprises a first NOR-gate and an inverter, wherein the inverter is coupled between the data input and a first input of the first NOR-gate, wherein the second input of the first NOR-gate is coupled to the enable input and wherein an output of the first NOR-gate is coupled to the reset input of the first reset-set latch, and
   wherein the second logic circuit comprises a second NOR-gate, wherein a first input of the second NOR-gate is coupled to the data input, a second input of the second NOR-gate is coupled to the enable input and the output of the second NOR- gate is coupled to the reset input of the second reset-set latch.

7. The storage circuit with fault detection according to claim 5, wherein the first logic circuit comprises a first AND-gate, wherein a first input of the first AND-gate is coupled to the data input, wherein a second input of the first AND-gate is coupled to the enable input and wherein an output of the AND-gate is coupled to the reset input of the first reset-set latch;
   the second logic circuit comprises a second AND-gate and an inverter, wherein the inverter is coupled between a first input of the second AND-gate and the data input, wherein the second input of the AND-gate is coupled to the enable input and wherein the output of the AND-gate is coupled to the reset input of the second reset-set latch.

8. The storage circuit with fault detection according to claim 5, further comprising a third logic circuit configured to output an alarm signal if signals, which, depending on the signal states at the first and second outputs, indicate an invalid combination of signal states at the outputs.

9. The storage circuit with fault detection according to claim 8, wherein the third logic circuit is formed in a semiconductor substrate physically adjacent to the first and second logic circuits or between the first and second logic circuits.

10. The storage circuit according to claim 9, wherein the semiconductor substrate comprises p- and n-type doped regions, and wherein the first, the second and the third logic circuits are arranged neighboring to potential terminals of the p- and /or n-type doped regions in the semiconductor substrate.

11. The storage circuit with fault detection according to claim 8, wherein each of the first, second and third logic circuits comprise transistors of different doping types, wherein in the first and second logic circuits, transistors of a first doping type are dimensioned to obtain a higher current yield than transistors of a second doping type, and, in the third logic circuit, transistors of the second doping type are dimensioned to obtain a higher current rate than transistors of the first doping type.

12. A memory device, comprising:
a memory controller;
a plurality of storage circuits with fault detection, each storage circuit comprising:
first and second fault detection circuits each comprising a first stable state and a second stable state, wherein each of the first and the second fault detection circuits is configured such that a fault signal strength necessary to cause switching from the first stable state to the second stable state is different from a fault signal strength necessary to cause switching from the second stable state to the first stable state;
a data input;
a circuitry configured to cause the first fault detection circuit to assume the first stable state and the second fault detection circuit to assume the second stable state to store a data signal applied to the data input; and
a first output indicative of the state of the first fault detection circuit and a second output indicative of the state of the second fault detection circuit, wherein an invalid combination of the signal states at the first and second outputs indicates a fault;
wherein each storage circuit comprises an address, and wherein the memory controller is configured to control storing of data into the storage circuit, and reading of data from the storage circuit; and
a monitor circuit configured to monitor an indication of a fault,
wherein each of the plurality of storage circuits with fault detection further comprise an enable input, wherein the circuitry is configured to allow storage of a data signal applied to the data input if an enable signal is applied from the memory controller to the enable input and to prevent storage of the data signal applied to the data input if the enable signal from the memory controller is not applied to the enable input.

13. The memory device according to claim 12, wherein the circuitry of each of the plurality of storage circuits with fault detection is configured to output an alarm signal if signal states at the first and second outputs indicate a fault.

14. A storage circuit with fault detection, comprising:
a data input;
an enable input;
first and second fault detection circuits each comprising a first stable state and a second stable state, wherein each of the first and the second fault detection circuits is configured such that a fault signal strength necessary to cause switching from the first stable state to the second stable state is different from a fault signal strength necessary to cause switching from the second stable state to the first stable state, wherein the first fault detection circuit comprises a reset input, a set input and at least a first output, wherein the second fault detection circuit comprises a reset input, a set input and at least a second output, and wherein the first output is coupled to the set input of the second fault detection circuit and the second output is coupled to the set input of the first fault detection circuit;
a first logic circuit configured to provide a reset signal to the reset input of the first fault detection circuit, and
a second logic circuit configured to provide a reset signal to the reset input of the second fault detection circuit,
wherein the first and the second logic circuits are configured to allow storing of a data signal applied to the data input if an enable signal is applied to the enable input and to prevent storage of the data signal applied to the data input if the enable signal is not applied to the enable input, and
wherein the first output is indicative of the state of the first fault detection circuit and the second output is indicative of the state of the second fault detection circuit, wherein an invalid combination of the signal states at the first and second outputs indicates a fault.

15. The storage circuit with fault detection according to claim 14, further comprising a first inverter coupled between the first output of the first fault detection circuit and the set input of the second fault detection circuit and a second inverter coupled between the second output of the second detection circuit and the set input of the first fault detection circuit.

16. The storage circuit with fault detection according to claim 14, wherein the first fault detection circuit comprises a first reset-set latch and wherein the second fault detection circuit comprises a second reset-set latch.

17. The storage circuit with fault detection according to claim 14, wherein the first logic circuit comprises a first NOR-gate and an inverter, wherein the inverter is coupled between the data input and a first input of the first NOR-gate, wherein the second input of the first NOR-gate is coupled to the enable input and wherein an output of the first NOR-gate is coupled to the reset input of the first reset-set latch, and wherein the second logic circuit comprises a second NOR-gate, wherein a first input of the second NOR-gate is coupled to the data input, a second input of the second NOR-gate is coupled to the enable input and the output of the second NOR-gate is coupled to the reset input of the second reset-set latch.

18. A storage circuit with fault detection, comprising:
a master-latch comprising:
a data input;
an enable input;
a first and a second master-latch output;
first and second fault detection circuits each comprising a first stable state and a second stable state, wherein each of the first and the second fault detection circuits is configured such that a fault signal strength necessary to cause switching from the first stable state to the second stable state is different from a fault signal strength necessary to cause switching from the second stable state to the first stable state, wherein the first fault detection circuit comprises a reset input, a set input and a first output forming the first master-latch output, and wherein the second fault detection circuit comprises a reset input, a set input and a second output forming the second master-latch output;
a first logic circuit having inputs coupled to the data input and the enable input and an output coupled to the reset input of the first fault detection circuit; and
a second logic circuit having inputs coupled to the data input and the enable input and an output coupled to the reset input of the second fault detection circuit; and
a slave-latch comprising:

a first and a second data input;
an enable input;
a first and a second slave-latch output;
first and second fault detection circuits each comprising a first stable state and a second stable state, wherein each of the first and the second fault detection circuits is configured such that a fault signal strength necessary to cause switching from the first stable state to the second stable state is different from a fault signal strength necessary to cause switching from the second stable state to the first stable state, wherein the first fault detection circuit comprises a reset input, a set input and a first output forming the first slave-latch output, and wherein the second fault detection circuit comprises a reset input, a set input and at least a second output forming a second slave-latch output;
a first logic circuit having an input coupled to the first data input of the slave-latch and a second input coupled to the enable input of the slave-latch and an output coupled to. the reset input of the first fault detection circuit at the slave-latch; and
a second logic circuit having an input coupled to the second data input and a second input coupled to the enable input of the slave-latch and an output coupled to the reset input of the second fault detection circuit of the slave-latch;
wherein the first master-latch output is coupled to the first data input of the slave-latch and the second master-latch output is coupled to the second data input of the slave-latch, and wherein the enable input of the master-latch is adapted to receive an enable signal and wherein the enable input of the slave-latch is adapted to receive an inverted version of the enable signal.

* * * * *